(12) United States Patent
Miura

(10) Patent No.: US 7,922,292 B2
(45) Date of Patent: Apr. 12, 2011

(54) DROPLET DISCHARGE HEAD AND DROPLET DISCHARGE DEVICE

(75) Inventor: Hirotsuna Miura, Fujimi (JP)

(73) Assignee: Seiko Epson Corporation (JP)

( * ) Notice: Subject to any disclaimer, the term of this patent is extended or adjusted under 35 U.S.C. 154(b) by 373 days.

(21) Appl. No.: 12/144,879

(22) Filed: Jun. 24, 2008

(65) Prior Publication Data
US 2009/0021560 A1    Jan. 22, 2009

(30) Foreign Application Priority Data
Jul. 17, 2007 (JP) ................................ 2007-185935

(51) Int. Cl.
B41J 2/14    (2006.01)
B41J 2/01    (2006.01)

(52) U.S. Cl. ......................................... 347/51; 347/102

(58) Field of Classification Search .................... 347/20, 347/51, 102
See application file for complete search history.

(56) References Cited

U.S. PATENT DOCUMENTS

| 6,927,018 | B2* | 8/2005 | Burgess | 430/324 |
| 2001/0038408 | A1* | 11/2001 | Codos et al. | 347/102 |
| 2004/0090794 | A1* | 5/2004 | Ollett et al. | 362/555 |
| 2006/0209150 | A1 | 9/2006 | Iwata | |

FOREIGN PATENT DOCUMENTS

| JP | 2001-014941 | 1/2001 |
| JP | 2003-197881 | 7/2003 |
| JP | 2004-119581 | 4/2004 |
| JP | 2005-057139 | 3/2005 |
| JP | 2006-247529 | 9/2006 |
| JP | 2006-247622 | 9/2006 |
| JP | 2006-248189 | 9/2006 |
| JP | 2006-255656 | 9/2006 |

* cited by examiner

*Primary Examiner* — An H Do
(74) *Attorney, Agent, or Firm* — Harness, Dickey & Pierce, P.L.C.

(57) ABSTRACT

A droplet discharge head includes: a head body having a surface opposed to an object; a plurality of nozzles aligned on the surface and discharging a droplet to each of positions of the object; and an irradiation part disposed on the surface and irradiating the object with light. In the droplet discharge head, the irradiation part includes i×j pieces of irradiation parts arranged such that i (an integer number of 1 or more) pieces of irradiation parts are aligned in an alignment direction of the nozzles and j (an integer number of 2 or more) pieces of irradiation parts are disposed in a predetermined direction that is orthogonal to the alignment direction of the nozzles and aligned along the predetermined direction.

7 Claims, 6 Drawing Sheets

DROPLET DISCHARGE HEAD AND DROPLET DISCHARGE DEVICE

BACKGROUND

1. Technical Field

The present invention relates to a droplet discharge head and a droplet discharge device.

2. Related Art

Multi-layered substrates made of low temperature co-fired ceramics (LTCC) are widely used for a substrate of a high frequency module, a substrate of an IC package, and the like due to their excellent high-frequency property and high heat-resistance. In a method for manufacturing an LTCC multi-layered substrate, a step in which a circuit pattern is drawn on a green sheet with a metal ink and a step in which a plurality of green sheets are layered so as to be fired all together are commonly conducted.

In terms of the step in which a circuit pattern is drawn, JP-A-2005-57139, as a first example, discloses an ink-jet method in which a metal ink is discharged as fine droplets for densifying the circuit pattern. By the ink-jet method, one circuit pattern is drawn with a lot of droplets. A bulk of one droplet is several to several dozen picoliters. The ink-jet method enables the circuit pattern to be fine and have a narrow pitch by changing discharge positions of the droplets. However, if the circuit pattern made from droplets is dried in a dry furnace, a heating treatment is conducted on the whole of the green sheet, increasing a heat load imposed on the circuit pattern and the green sheet.

Therefore, for the ink-jet method, proposals for resolving the above problem have been conventionally made. In JP-A-2006-247529 as a second example, JP-A-2006-248189 as a third example, and JP-A-2006-247622 as a fourth example, a droplet discharge head that discharges droplets is provided with a laser emitting part and irradiates a droplet that is discharged with laser light so as to dry the droplet in a moment. Laser light emitted by the laser emitting part supplies an amount of heat required only for a region of the droplets. Therefore, thermal damage of the circuit pattern and the green sheet can be substantially avoided. As a method for manufacturing such laser emitting part, JP-A-2003-197881 as a fifth example proposes that a vertical cavity surface emitting laser (VCSEL) is formed on a lattice-matching substrate and then the vertical cavity surface emitting laser is separated from the substrate so as to be bonded to other base. Thus, a laser emitting part can be provided to a substrate lattice-mismatching with the laser emitting part. As a method for manufacturing an optical member required for the laser emitting part, JP-A-2004-119581 as a sixth example proposes that a micro-lens is formed on an emitting face of the laser emitting part by the ink-jet method. Accordingly, an emission angle and a wavelength of laser light emitted from the vertical cavity surface emitting laser can be controlled with higher accuracy.

In the ink-jet method, an object and a droplet discharge head are relatively moved so as to draw a circuit pattern having a desired shape. A droplet on the object passes a spot of laser light in such a momentary period of time that the object and the droplet discharge head relatively move, that is, in such a momentary period of time that the droplet and the laser emitting part relatively move. Thus, an irradiation time with the laser light is decreased due to the relative move.

A forming pitch of nozzles provided to the droplet discharge head is several dozen μm to several hundred μm. A spot size of the laser light has to be nearly same as the forming pitch of the nozzles so as to irradiate each droplet with the laser light. Thus, since the spot size of the laser light is small, a time for irradiating the droplets with the laser light is further decreased.

In order to dry the droplets, the region for the droplets has to be irradiated with the whole energy required for the drying in such short irradiation time described above. However, irradiation of laser light having high energy with respect to the droplets of several to several dozen picoliters causes bumping of the droplets instantly, eliminating the circuit pattern near the droplets. On the other hand, in a case of emitting laser light having low energy, a moving velocity of the droplet discharge head with respect to the substrate has to be sufficiently slow. Therefore, productivity of various patterns is substantially degraded.

SUMMARY

An advantage of the present invention is to provide a droplet discharge head and a droplet discharge device that increase an irradiation time with light without degrading performance of a droplet discharging treatment so as to provide a stable dried-state to droplets.

A droplet discharge head according to a first aspect of the invention includes: a head body having a surface opposed to an object; a plurality of nozzles aligned on the surface and discharging a droplet to each of positions of the object; and an irradiation part disposed on the surface and irradiating the object with light. In the droplet discharge head, the irradiation part includes i×j pieces of irradiation parts arranged such that i (an integer number of 1 or more) pieces of irradiation parts are aligned in an alignment direction of the nozzles and j (an integer number of 2 or more) pieces of irradiation parts are disposed in a predetermined direction that is orthogonal to the alignment direction of the nozzles and aligned along the predetermined direction.

According to the droplet discharge head of the first aspect, when the droplet discharge head and the object relatively move in the predetermined direction, a droplet that is discharged from a nozzle is irradiated with light emitted from j pieces of irradiation parts. Therefore, in a coordinate space along the predetermined direction, irradiation time for a droplet is increased in accordance with j, that is, the number of irradiation parts. Accordingly, the droplet discharge head can increase the irradiation time of light independently from the relative-moving velocity thereof with respect to the object and the spot size of light. The droplet discharge head can conduct an irradiation of light having low energy with respect to the droplet for a long period of time, preventing bumping and a lack of drying of the droplet. Therefore, the droplet discharge head can provide a stable drying state to the droplet without degrading performance in the droplet discharge treatment.

In the droplet discharge head of the first aspect, the irradiation parts may include: first irradiation parts disposed in the predetermined direction of the nozzles and irradiating a first part of a line that passes through one of the positions opposed to the nozzles and extends along the predetermined direction with the light, and second irradiation parts disposed in the predetermined direction of the first irradiation parts and irradiating a second part that is different from the first part on the line with the light.

According to the droplet discharge head of the first aspect, when the droplet discharge head and the object relatively move in the predetermined direction, a droplet that is discharged from a nozzle passes through the first part and the second part of the line. Therefore, in a coordinate space along the predetermined direction, an irradiation time for a droplet is increased in accordance with the number of the first irradiation part and the second irradiation parts. As a result, the droplet discharge head can conduct an irradiation of light having low energy with respect to the droplet for a long period of time. Therefore, the droplet discharge head can provide a stable drying state to the droplet without degrading performance in the droplet discharge treatment.

In the droplet discharge head of the first aspect, it is preferable that the light be laser light, the first irradiation parts be mounted on the surface and include first vertical cavity surface emitting lasers emitting the laser light, and the second irradiation parts be mounted on the surface and include second vertical cavity surface emitting lasers emitting the laser light.

According to the droplet discharge head of the first aspect, the irradiation parts include the vertical cavity surface emitting lasers, and an emitting surface of each of the vertical cavity surface emitting lasers and a forming surface of the nozzles are nearly coplanar. Therefore, the droplet discharge head can mount the plurality of irradiation parts without changing a distance with respect to the object. Accordingly, the droplet discharge head can maintain landing accuracy of the droplet and can provide high positional-matching between the droplet and an irradiation region of the laser light. As a result, the droplet discharge head can more securely stabilize the drying state of the droplet.

In the droplet discharge head of the first aspect, it is preferable that the first irradiation parts have a first optical system focusing the laser light emitted by the first vertical cavity surface emitting lasers on the first part, and the second irradiation parts have a second optical system focusing the laser light emitted by the second vertical cavity surface emitting lasers on the second part.

According to the droplet discharge head of the first aspect, the optical system narrows an irradiation angle of the laser light, enhancing irradiation accuracy of the laser light with respect to each of the positions. Further, the optical system focuses the laser light on each of the positions, increasing energy density of the laser light. Therefore, the droplet discharge head can expand the changing range of the irradiation amount for each droplet, being able to further stabilize the drying state of the droplet.

In the droplet discharge head of the first aspect, it is preferable that the first part be closer to each of the positions than the second part, and the first optical system have a lower light focusing rate than the second optical system.

In the droplet discharge head of the first aspect, it is preferable that the first part is closer to each of the positions than the second part, and the first irradiation parts emit light having lower intensity than light that the second irradiation parts emit.

According to the droplet discharge head of the first aspect, a plurality of droplets discharged from the nozzles receive low energy immediately after they are discharged and then receive high energy. Therefore, the droplet discharge head can more securely prevent bumping and a lack of drying of the droplet.

In the droplet discharge head of the first aspect, it is preferable that at least one of the first optical system and the second optical system include a deflection part deflecting light traveling in a direction apart from each of the positions to a direction approaching each of the positions when the light is viewed from a normal line direction of the surface.

According to the droplet discharge head of the first aspect, since light traveling apart from a position opposed to a nozzle is deflected to a direction approaching the position, the energy density increases at a region close to the position opposed to the nozzle. Therefore, the droplet discharge head can change the energy density on a line passing through the position opposed to the nozzle. As a result, the droplet discharge head can expand the drying condition of the droplet, being able to further stabilize the drying state of the droplet.

In the droplet discharge head of the first aspect, it is preferable that the first optical system and the second optical system be micro lenses, and each of the micro lenses be formed by an ink-jet method.

According to the droplet discharge head of the first aspect, a forming pitch of the micro lenses corresponds to a forming pitch of the nozzles. Therefore, the droplet discharge head can provide high positional-matching to the vertical cavity surface emitting lasers and the micro lenses. As a result, the droplet discharge head can further stabilize the drying state of the droplet.

In the droplet discharge head of the first aspect further includes a cooling part cooling at least one of a heat generating part of the head body and the irradiation parts.

According to the droplet discharge head of the first aspect, the cooling part secures thermal stability of the head body. Therefore, the droplet discharge head can conduct the droplet discharge treatment and the light irradiation treatment under high stability.

A droplet discharge device according to a second aspect of the invention includes: a droplet discharge head discharging a droplet to an object; and a controlling unit drive-controlling the droplet discharge head by relatively moving the droplet discharge head and the object in a predetermined direction. In the droplet discharge device, the droplet discharge head includes a head body having a surface opposed to the object, a plurality of nozzles aligned on the surface along a direction orthogonal to the predetermined direction and discharging the droplet to each of positions on the object opposed to the plurality of nozzles, and i×j pieces of irradiation parts arranged such that i (an integer number of 1 or more) pieces of irradiation parts are aligned along an alignment direction of the nozzles and j (an integer number of 2 or more) pieces of irradiation parts are disposed in a predetermined direction that is orthogonal to the alignment direction of the nozzles and aligned along the predetermined direction. In the droplet discharge device, when the controlling unit allows the object to move relatively to the droplet discharge head in the predetermined direction so as to discharge the droplet to a selected position that is selected from the positions, the controlling unit allows the j pieces of irradiation parts disposed in the predetermined direction of a nozzle opposed to the selected position to irradiate the object with light.

According to the droplet discharge device of the second aspect, the droplet discharged toward the object receives light from j pieces of irradiation parts. Therefore, in a coordinate space along the predetermined direction, irradiation time for a droplet is increased in accordance with j, that is, the number of irradiation parts. Accordingly, the droplet discharge device can increase the irradiation time of light independently from the relative-moving velocity of the droplet discharge head with respect to the object and the spot size of light. The droplet discharge device can irradiate the droplet with light having low energy for a long period of time, preventing bumping and a lack of drying of the droplet. Therefore, the droplet discharge device can provide a stable drying state to the droplet without degrading performance in the droplet discharge treatment.

In the droplet discharge device of the second aspect, the irradiation parts may include first irradiation parts disposed in the predetermined direction of the nozzles and irradiating a first part of a line that passes through one of the positions opposed to the nozzles and extends along the predetermined direction with the light, and second irradiation parts disposed in the predetermined direction of the first irradiation parts and irradiating a second part that is different from the first part on the line with the light. In the device, when the controlling unit relatively moves the droplet discharge head and the object in the predetermined direction so as to discharge the droplet on a selected position selected from the positions, the controlling unit allows one of the first irradiation parts disposed in the predetermined direction of a nozzle opposed to the selected position to irradiate the first part with light and allows second irradiation parts disposed in the predetermined direction of the nozzle opposed to the selected position to irradiate the second part with light.

According to the droplet discharge device of the second aspect, the droplet discharged toward the object passes the first part and the second part. Therefore, in a coordinate space along the predetermined direction, irradiation time for a droplet is increased in accordance with the number of the first irradiation part and the second irradiation parts. Accordingly, the droplet discharge device can increase the irradiation time of light independently from the relative-moving velocity of the droplet discharge head with respect to the object and the spot size of light. As a result, the droplet discharge device can irradiate the droplet with light having low energy for a long period of time. Therefore, the droplet discharge device can provide a stable drying state to the droplet without degrading performance in the droplet discharge treatment.

In the droplet discharge device of the second aspect, it is preferable that the light be laser light, the first irradiation parts be mounted on the surface and include first vertical cavity surface emitting lasers emitting the laser light, and the second irradiation parts be mounted on the surface and include second vertical cavity surface emitting lasers emitting the laser light.

According to the droplet discharge device of the second aspect, the irradiation parts include the vertical cavity surface emitting lasers, and an emitting surface of each of the vertical cavity surface emitting lasers and a forming surface of the nozzles are nearly coplanar. Therefore, the droplet discharge device can mount the plurality of irradiation parts without changing a distance between the object and the droplet discharge head. Accordingly, the droplet discharge device can maintain landing accuracy of the droplet and can provide high positional-matching between the droplet and an irradiation region of the laser light. As a result, the droplet discharge device can more securely stabilize the drying state of the droplet.

In the droplet discharge device of the second aspect, it is preferable that the controlling unit allow light emitted form the first irradiation parts to have a smaller intensity than light emitted from the second irradiation parts.

According to the droplet discharge device of the second aspect, a plurality of droplets discharged from the nozzles receive low energy immediately after they are discharged and then receive high energy. Therefore, the droplet discharge device can more securely prevent bumping and a lack of drying of the droplet.

In the droplet discharge device of the second aspect, it is preferable that the controlling unit include a selection signal generating part generating a selection signal for selecting a nozzle opposed to the selected position from the plurality of nozzles, and it is preferable that the controlling unit selectively drive the nozzle opposed to the selected position based on the selection signal, and selectively drive a first irradiation part disposed in the predetermined direction of the nozzle opposed to the selected part from the first irradiation parts and selectively drive a second irradiation part disposed in the predetermined direction of the nozzle opposed to the selected part from the second irradiation parts based on the selection signal.

According to the droplet discharge device of the second aspect, each of the nozzles and each of the irradiation parts are selectively driven based on a selection signal that is common to the nozzle and the irradiation part. Therefore, the droplet discharge device can more securely irradiate the droplet that is discharged with light emitted from a corresponding irradiation part. As a result, the droplet discharge device can further stabilize the drying state of the droplet.

In the droplet discharge device, it is preferable that the controlling unit include a timing signal generating part generating a timing signal expressing a discharge timing of the droplet, and it is preferable that the controlling unit drive the nozzles based on the timing signal and drive each of the first irradiation parts and the second irradiation parts based on the timing signal.

According to the droplet discharge device of the second aspect, each of the nozzles and each of the irradiation parts are driven based on a timing signal that is common to the nozzle and the irradiation part. Therefore, the droplet discharge device can more securely irradiate the droplet that is discharged with light under more stable timing. As a result, the droplet discharge device can further stabilize the drying state of the droplet.

In the droplet discharge device of the second aspect, it is preferable that the first part be closer to each of the positions than the second part, and it is preferable that the controlling unit include a timing signal generating part generating a timing signal expressing a discharge timing of the droplet and a delay signal generating part generating a delay signal delaying for a predetermined period of time from the timing signal, and that the controlling unit drive the nozzles based on the timing signal, drive the first irradiation parts based on the timing signal, and drive the second irradiation parts based on the delay signal.

According to the droplet discharge device of the second aspect, each of the nozzles and each of the first irradiation parts are driven at discharge timing that is common to the nozzle and the first irradiation part. Further, each of the second irradiation parts is driven at timing delaying for a predetermined period of time from the timing signal. Therefore, the droplet discharge device can reduce the irradiation amount of light with which the object is irradiated at an extent that the irradiation timing of the second irradiation parts is delayed. As a result, the droplet discharge device can decrease damage on the object caused by the light.

In the droplet discharge device of the second aspect, it is preferable that the nozzles include a pressure generating element that repeats charging and discharging of electricity so as to discharge the droplet, and preferable that the controlling unit include a timing signal generating part generating a timing signal expressing a timing of charging and discharging of electricity of the pressure generating element, charge and discharge electricity of the pressure generating element of a predetermined nozzle, and supply the first irradiation part to which the predetermined nozzle corresponds with electricity discharged from the pressure generating element so as to drive the first irradiation parts.

According to the droplet discharge device of the second aspect, the pressure generating elements are driven at an electrical charging and discharging timing that is common in the pressure generating elements, and each of the first irradiation parts is driven by discharging current from a corresponding pressure generating element. Therefore, the droplet discharge device can more securely irradiate the droplet that is discharged with light. As a result, the droplet discharge device can further stabilize the drying state of the droplet.

BRIEF DESCRIPTION OF THE DRAWINGS

The invention will be described with reference to the accompanying drawings wherein like numbers reference like elements.

DESCRIPTION OF THE EXEMPLARY EMBODIMENTS

First Embodiment

Figure 1:
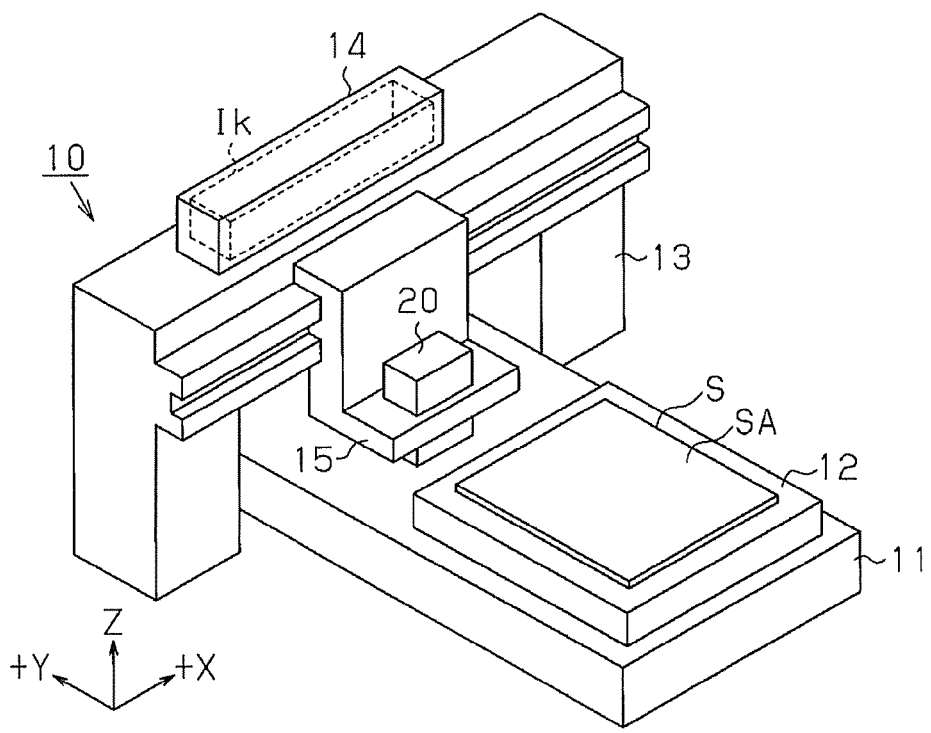
FIG. 1 is a perspective view showing a droplet discharge device according to a first embodiment.

A first embodiment of the invention will be described below with reference to FIGS. 1 to 5. FIG. 1 is a perspective view showing a droplet discharge device 10.

Referring to FIG. 1, the droplet discharge device 10 includes a base 11 extending in one direction and a stage 12 mounted on the base 11 and placing a substrate S thereon. The stage 12 positions and fixes the substrate S in a manner allowing one surface of the substrate S to face up so as to move the substrate S along a longitudinal direction of the base 11. Various kinds of substrate such as a green sheet, a glass substrate, a silicon substrate, a ceramic substrate, a resin film, a paper, and the like may be used as the substrate S.

In the first embodiment, an upper surface of the substrate S is called a discharge surface SA. A direction along which the substrate S is moved, that is, a direction toward upper left in FIG. 1 is referred to as +Y direction. A direction orthogonal to +Y direction, that is, a direction toward upper right in FIG. 1 is referred to as +X direction, and a normal line direction of the substrate S is referred to as Z direction.

The droplet discharge device 10 further includes a guide member 13 having a gate shape and straddling the base 11 and an ink tank 14 provided to the upside of the guide member 13. The ink tank 14 stores a predetermined ink Ik and guides the ink Ik that is stored out at a predetermined pressure. Various inks such as a silver ink containing silver fine particles, an indium tin oxide (ITO) ink containing ITO fine particles, a pigment ink containing a pigment, and the like are used as the ink Ik.

The guide member 13 supports a carriage 15 such that the carriage 15 can move along +X direction and an opposite direction of +X direction (−X direction). The carriage 15 mounts the droplet discharge head 20 and moves along +X direction and −X direction so as to position the droplet discharge head 20 with respect to the substrate S. An operation of moving the substrate S in +Y direction is referred to as a main scanning and an operation of moving the droplet discharge head 20 in +X direction and −X direction is referred to as a sub scanning.

Figure 2:
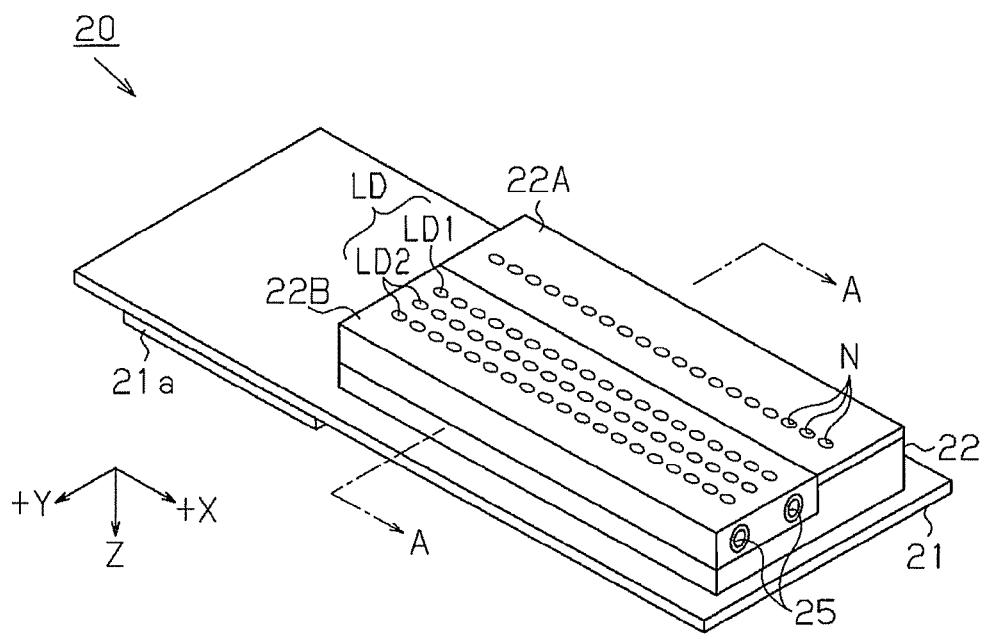
FIG. 2 is a perspective view showing a droplet discharge head according to the first embodiment.
Figure 3:
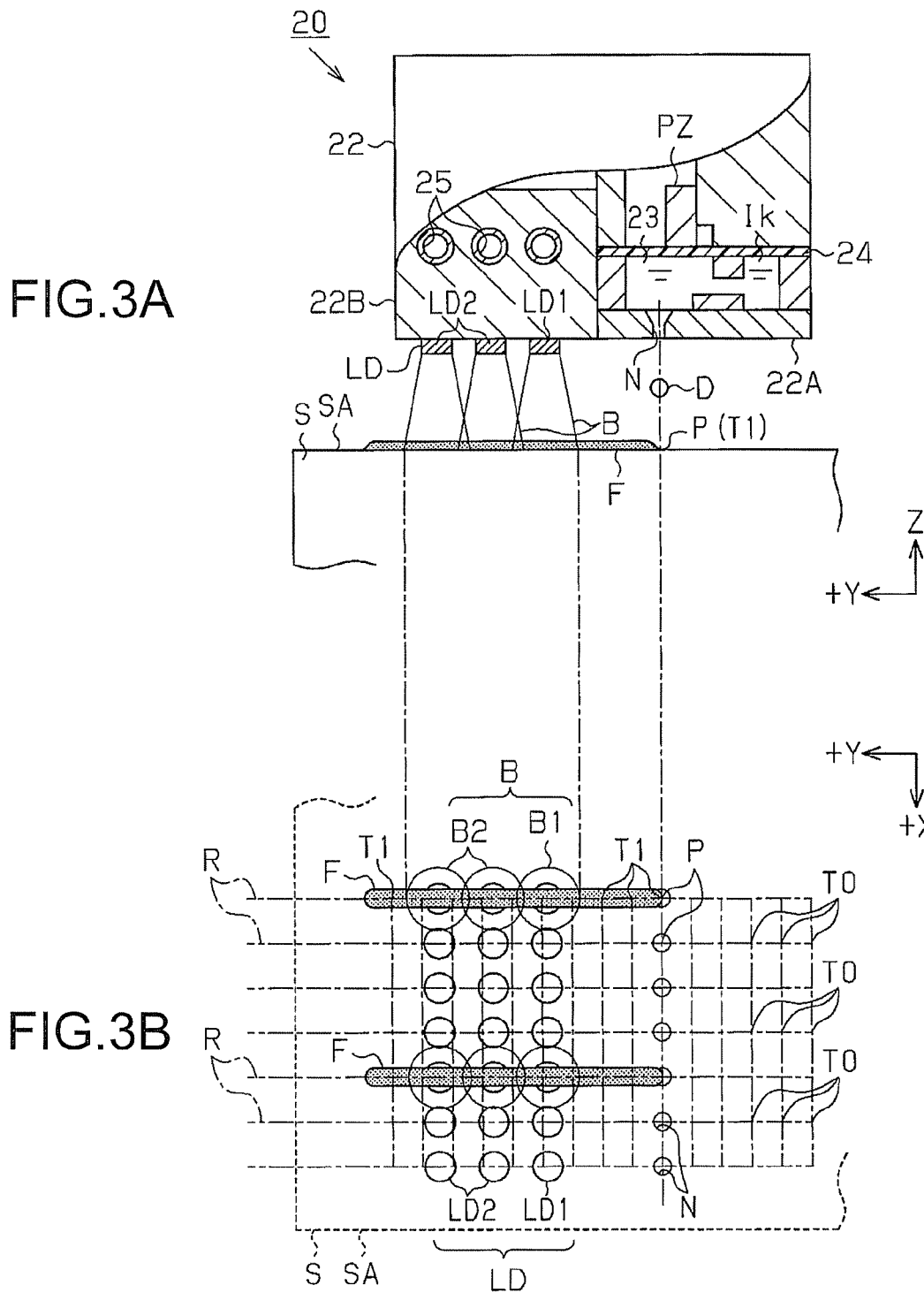
FIGS. 3A and 3B are respectively a sectional side view schematically showing a droplet discharge head and a plan view schematically showing a droplet discharging operation according to the first embodiment.

The droplet discharge head 20 will be described below. FIG. 2 is a perspective view showing the droplet discharge head 20 viewed from the stage 12. FIG. 3A is a sectional view taken along the line A-A of FIG. 2 and showing a droplet discharging operation of the droplet discharge head 20. FIG. 3B is a plan view of a nozzle N and a laser LD of the droplet discharge head 20 viewed from the discharge surface SA.

Referring to FIG. 2, the droplet discharge head 20 includes a head substrate 21 extending along +X direction and a head body 22 supported by the head substrate 21. The head substrate 21 is positioned and fixed by the carriage 15 and moves along +X direction and −X direction with respect to the substrate S. The head substrate 21 includes an input terminal 21a at an end side thereof so as to output a driving waveform signal that is inputted into the input terminal 21a to the head body 22.

The head body 22 includes a nozzle plate 22A and a laser plate 22B at a side facing the substrate S. When the droplet discharge head 20 faces the substrate S, the nozzle plate 22A is disposed nearly parallel to the discharge face SA and is kept to be at a predetermined distance from the discharge surface SA. Here, the distance between the nozzle plate 22A and the discharge surface SA is called a platen gap. The platen gap is, for example, several hundred μm and the gap is set to be in a sufficiently short distance so as to secure a landing accuracy of droplets.

The nozzle plate 22A is provided with i (which is an integer number of 1 or more) pieces of nozzles N along nearly whole width thereof in +X direction. The nozzles N are formed on the nozzle plate 22A in a penetrating manner in Z direction and arranged along +X direction at a predetermined pitch. For example, the nozzle plate 22A is provided with 180 nozzles N that are arranged along +X direction at a pitch of 141 μm.

Referring to FIG. 3A, the head body 22 includes a cavity 23, a vibrating plate 24, and a piezoelectric element PZ as a pressure generating element at an upside of each of the nozzles N. The cavity 23 is coupled with the ink tank 14 that is shared with other cavities 23, stores the ink Ik from the ink tank 14, and supplies the ink Ik to a nozzle N with which the cavity 23 communicates. The vibrating plate 24 vibrates in Z direction so as to increase and decrease the volume of the cavity 23, vibrating a meniscus of the nozzle N with which the vibrating plate 24 communicates. When the piezoelectric element PZ receives a driving waveform signal, the piezoelectric element PZ stretches and constricts in Z direction so as to vibrate the vibrating plate 24 provided thereunder in Z direction. When the vibrating plate 24 vibrates in Z direction, the cavity 23 corresponding to the vibrating plate 24 discharges a part of the ink Ik stored therein as a droplet D that has a predetermined weight from the nozzle N with which the cavity 23 communicates. For example, each cavity 23 discharges a part of an aqueous metal ink stored therein as a droplet D of long.

In the first embodiment, a position that is on the discharge surface SA and is immediately under each of the nozzles N is referred to as a discharge position P. A virtual line extending in +Y direction through the discharge position P is referred to as a discharge path R.

Referring to FIG. 3B, the discharge surface SA is virtually divided by a dot pattern grid shown by a dashed-dotted line. A grid spacing in +Y direction and a grid spacing in +X direction in the dot pattern grid are determined by a discharge spacing of the droplet D. For example, the discharge spacing in +Y direction is determined by a discharge frequency of the droplet D and a main scanning velocity of the substrate S. While, the discharge spacing in +X direction is determined by a forming pitch of the nozzles N, for example. A selection whether the droplet D is discharged or not is determined on each grid point T0 of the dot pattern grid. In the first embodiment, the grid point T0 on which a discharging operation of the droplet D is selected is referred to as a target point T1.

When the discharge treatment of the droplet D is conducted, the droplet discharge head 20 is positioned by sub scanning so as to set one discharge path R on which a group of grid points T0 are arranged in +Y direction. Each of the grid points T0 in the group on one discharge path R passes one discharge position P that is on the discharge path R by the main scanning of the substrate S. That is, the sub scanning of the droplet discharge head 20 and the main scanning of the substrate S determine a group of target points T1 arranged in +Y direction correspondingly to one discharge path R and one discharge point P.

When a target point T1 is positioned on a discharge position P, this discharge position P is selected as a position to which the droplet D is discharged. A piezoelectric element PZ communicating with a nozzle N facing this discharge position P receives the driving waveform signal and thus the nozzle N discharges the droplet D. The droplet D discharged from the nozzle N is landed on the discharge position P facing the nozzle N, that is, the target point T1. The droplet D landed on each of the target points T1 spreads in a planar direction of the discharge surface SA so as to form a continuous film pattern F together with adjacent droplets D. For example, in a case where a group of grid points T0 arranged in +Y direction is selected as target points T1, as shown in FIG. 3B, the droplets D landed on respective target points T1 form a film pattern F that is belt-like and extending along the discharge path R. In FIGS. 3A and 3B, a region of the film pattern F is shown with color gradient.

Referring to FIG. 2, when the droplet discharge head 20 faces the substrate S, the laser plate 22B is disposed to be nearly parallel to the discharge surface SA in the same manner as the nozzle plate 22A, and a distance between the laser plate 22B and the discharge surface SA is kept at a platen gap. That is, the nozzle plate 22A and the laser plate 22B are disposed in a manner allowing their under surfaces to be nearly coplanar so as to form a common virtual surface facing the discharge surface SA on the bottom of the head body 22.

The laser plate 22B includes a flow channel 25 as a cooling part for circulating a cooling medium such as cooling water in the whole inside thereof. The laser plate 22B cools down a heat generation part (each piezoelectric element PZ and a head driving circuit, for example) and a laser LD of the head body 22 by heat exchange of the cooling medium that is circulated so as to maintain the head body 22 at a predetermined temperature. The laser plate 22B is made of high heat-conductive materials such as stainless and aluminum.

The laser plate 22B is provided with a plurality of lasers LD across nearly whole width thereof in +X direction. J (which is an integer number of 2 or more) pieces of the lasers LD are arranged in +Y direction of each of the nozzles N, and thus a laser array of i×j is formed on the nearly whole surface of the laser plate 22B. For example, 20 pieces of the lasers LD are arranged at a pitch of 50 μm in +Y direction of each of the nozzles N so as to form a laser array of 180×20 on the laser plate 22B.

J pieces of lasers LD arranged in +Y direction correspond to one nozzle N that is common in the j pieces of lasers LD, that is, one discharge position P and one discharge path R that are common in the j pieces of lasers LD. FIG. 2 shows less number of lasers LD so as to describe their arranging positions.

In the first embodiment, a laser LD which is closest to a nozzle N among j pieces of lasers LD is referred to as a first laser LD1 as a first irradiation part. J−1 pieces of lasers LD (two pieces of lasers in FIG. 2) arranged in +Y direction of the first laser LD1 among the j pieces of lasers LD are referred to as second lasers LD2 as second irradiation parts.

Each of the lasers LD irradiates the discharge surface SA with laser light B having an absorption wavelength (850 nm, for example) of the ink Ik at a predetermined energy. The energy of the laser light B is set in advance based on a test and the like. The energy is set to cause no bumping of the ink Ik and to progress drying of the ink Ik when the ink Ik enters a region of the laser light B. As each of the lasers LD, a vertical cavity surface emitting laser (VCSEL) having an emitting surface that is nearly in parallel to the virtual surface described above is used, for example. Accordingly, the thickness of each of the lasers LD in Z direction is sufficiently thin, so that each of the lasers LD can be mounted without expanding the platen gap.

As a method for manufacturing a vertical cavity surface emitting laser, a technique disclosed in the fifth example is used, for example. That is, vertical cavity surface emitting lasers are formed on a lattice-matching substrate and then peeled off from the substrate. Then each of the vertical cavity surface emitting lasers that are peeled off is bonded on the laser plate 22B, forming each of the lasers LD. Accordingly, each of the lasers LD can obtain a wide selecting range of the material of the laser plate 22B.

Referring to FIGS. 3A and 3B, when each of the lasers LD receives a predetermined driving signal, the each of the lasers LD irradiates a region on the discharge surface SA to which the laser LD faces with the laser light B. In the first embodiment, the laser light B emitted from the first laser LD1 is referred to as first laser light B1, while the laser light B emitted from the second lasers LD2 is referred to as second laser light B2.

Each first laser LD1 irradiates a part that is on a discharge path R opposed to the first laser LD1 and is in +Y direction of the discharge position P with the laser light B1. Each second laser LD2 irradiates a part that is on the discharge path R opposed to the second laser LD2 and is in +Y direction of the first laser light B1 with the second laser light B2. That is, the lasers LD respectively irradiate parts that are different parts from each other on the discharge path R opposed to the lasers LD and are in +Y direction of the discharge position P with the first laser light B1 and the second laser light B2. In the first embodiment, a part that is a part of the discharge path R and that is irradiated with the first laser light B1 is referred to as a first part, while parts that are on the discharge path R and that are irradiated with the second laser light B2 are referred to as second parts.

When the discharge treatment of the droplet D is conducted, the droplet D that lands on a target point T1 sequentially passes the first part and the second parts on a discharge path R that passes the target point T1 by the main scanning of the substrate S. When the droplet D that lands on the target point T1 passes the first part, it is encouraged to be dried with no bumping. When the droplet D that lands on the target point T1 passes the second parts, it is further encouraged to be dried in accordance with the number of the second parts.

As a result, the droplet discharge device 10 can increase the irradiation time of the laser light B with respect to the droplet D in accordance with the number of the first laser LD1 and the second lasers LD2 independently from the moving velocity of the substrate S and the spot size of the laser light B. Therefore, the droplet discharge device 10 can suppress bumping and excessive-expanding of the droplet D. Further, the range of the drying condition can be expanded correspondingly to the number of the first laser LD 1 and the second lasers LD2, so that a stable droplet discharge treatment can be conducted under the drying condition corresponding to the composition and the size of the droplet D.

Figure 4:
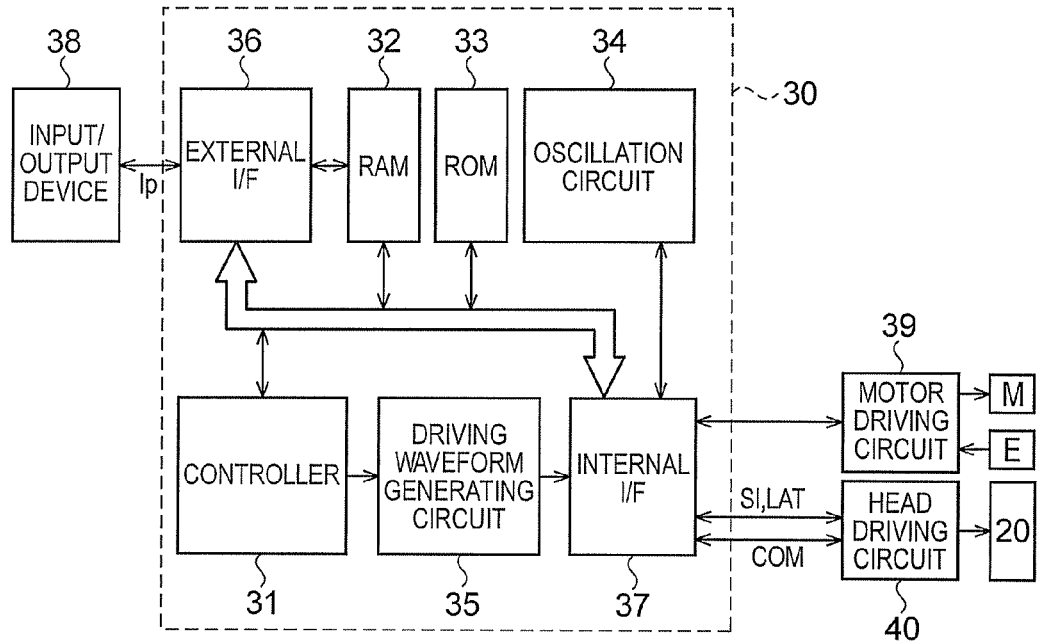
FIG. 4 is an electrical block diagram showing an electrical structure of the droplet discharge device according to the first embodiment.
Figure 5:
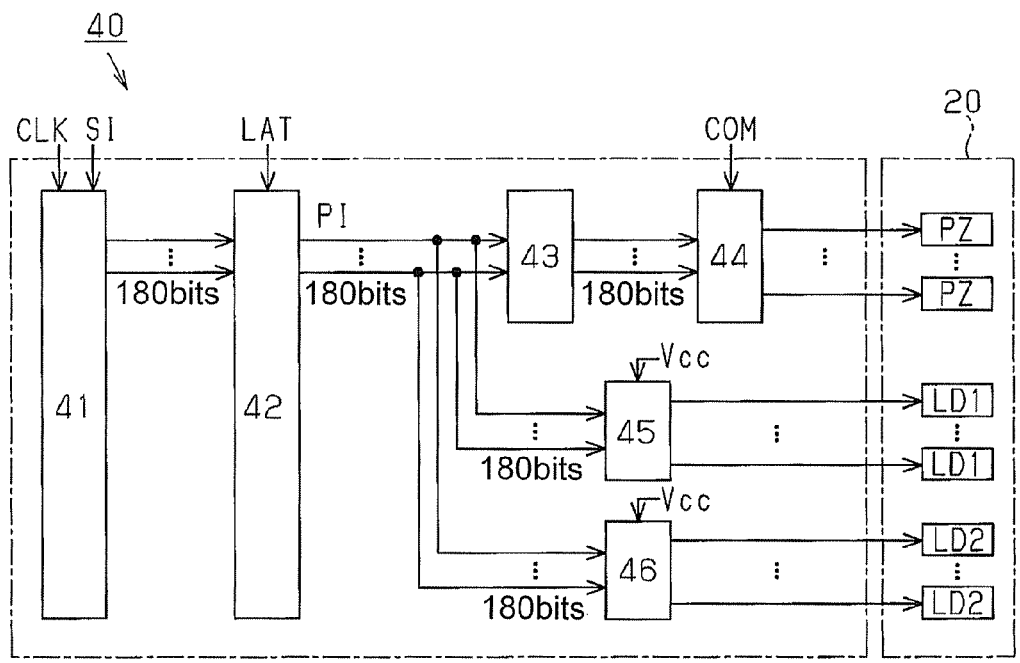
FIG. 5 is an electrical block diagram showing an electrical structure of a head driving circuit according to the first embodiment.

An electrical structure of the droplet discharge device 10 will now be described with reference to FIGS. 4 and 5. FIG. 4 is a block diagram showing the electrical structure of the droplet discharge device 10, and FIG. 5 is a block diagram showing an electrical structure of a head driving circuit included in a controlling unit.

Referring to FIG. 4, a controlling device 30 included in a controlling unit allows the droplet discharge device 10 to conduct various processing operations. The controlling device 30 includes a controller 31 including a CPU; a RAM 32 including a DRAM and a SRAM and storing various data; and a ROM 33 storing various controlling programs. The controlling device 30 further includes an oscillation circuit 34 generating a clock signal; a driving waveform generating circuit 35 generating a driving waveform signal; an external I/F 36 receiving various signals; and an internal I/F 37 sending various signals.

The controlling device 30 is coupled to an input/output device 38 via the external I/F 36. In addition, the controlling device 30 is coupled to a motor driving circuit 39 and a head driving circuit 40 via the internal I/F 37.

The input/output device 38 is an external computer which includes, for example, a CPU, a RAM, a ROM, a hard disk, and a liquid crystal display. The input/output device 38 outputs various controlling signals for driving the droplet discharge device 10 to the external I/F 36. The external I/F 36 receives a film pattern data Ip for forming a film pattern F from the input/output device 38. The film pattern data Ip includes a various kinds of data for discharging the droplet D such as data on the scanning velocity of the substrate S, data on the discharge cycle of the droplet D, and data on the coordinates of the grid point T0 and the target point T1.

The RAM 32 is used as a receiving buffer, an intermediate buffer, and an outputting buffer. The ROM 33 stores various controlling routines executed by the controller 31 and various data for executing the controlling routines.

The oscillation circuit 34 generates a clock signal that synchronizes various data and various driving signals. The oscillation circuit 34 generates a transfer clock CLK for serially transferring the various data, for example. The oscillation circuit 34 generates a timing signal LAT for performing a parallel conversion of the various data that is serially transferred, in every discharging cycle of the droplet D.

The driving waveform generating circuit 35 stores waveform data for generating driving waveform signals COM in such manner that the data corresponds to a predetermined address. The driving waveform generating circuit 35 latches waveform data read out by the controller 31 at every clock signal corresponding to the discharging cycle to convert it into an analog signal. Then, the driving waveform generating circuit 35 amplifies the analog signal to generate a driving waveform signal COM.

The external I/F 36 receives the film pattern data Ip outputted from the input/output device 38 and temporarily allow the RAM 32 to store the data so as to convert it into an intermediate code. The controller 31 reads out the intermediate code data that is stored in the RAM 32 so as to generate dotted pattern data. The dotted pattern data defines whether each of the grid points T0 of the dotted pattern grid is a target point T1 or not.

The controller 31 generates dotted pattern data equivalent to the amount of a single main scanning and uses the dotted pattern data to generate serial data that synchronizes with the transfer clock CLK. Thereafter, the controller 31 serially transfers the serial data to the head driving circuit 40 via the internal I/F 37. In the first embodiment, the serial data generated by using the dotted pattern data is referred to as serial pattern data SI. The serial pattern data SI is used for allowing a value of a bit for defining the discharge and non-discharge of the droplet D to correspond to each piezoelectric element PZ, and is generated at the discharging cycle of the droplet D.

The controller 31 is coupled to the motor driving circuit 39 via the internal I/F 37 to output a drive control signal corresponding to the motor driving circuit 39. The motor driving circuit 39 is coupled to various motors M for moving the stage 12 and the carriage 15 and to an encoder E for detecting rotating speeds and rotating directions of the motors M. The motor driving circuit 39 controls the driving of the motors M in response to the drive control signal received from the controller 31 and executes the sub scanning of the carriage 15 and the main scanning of the stage 12. The motor driving circuit 39 calculates moving directions and moving amounts of the stage 12 and the carriage 15 in response to the detecting signal received from the encoder E so as to output them to the controlling device 30. The controlling device 30 judges whether each of the grid points T0 is positioned on a discharge position P or not based on the moving direction and the moving amount of the stage 12 so as to generate a timing signal LAT when each of the grid points T0 is on the discharge position P.

Next, the head driving circuit 40 will be described. Referring to FIG. 5, the head driving circuit 40 includes a shift resister 41 included in a selection signal generating part; a control signal generating part 42; a level shifter 43; a piezoelectric element switch 44; a first laser switch 45; and a second laser switch 46.

The shift resister 41 sequentially shifts a serial pattern data SI in response to a transfer clock CLK received from the controlling device 30. The shift resister 41 stores the serial pattern data SI of corresponding number of bits to the number of the nozzles N (180 bits in the present embodiment).

The control signal generating part 42 latches the serial pattern data SI that has been stored in the shift resister 41 in response to the timing signal LAT received from the controlling device 30. The control signal generating part 42 conducts serial/parallel conversion with respect to the serial pattern data SI which is latched so as to generate parallel data of 180 bits that correspond to respective nozzles N, and output the parallel data to the level shifter 43, the first laser switch 45, and the second laser switch 46. In the first embodiment, the parallel data outputted from the control signal generating part 42 is referred to as a parallel pattern data PI as a selection signal.

The level shifter 43 boosts the parallel pattern data PI received from the control signal generating part 42 up to a driving voltage level of the piezoelectric element switch 44 so as to generate 180 switching signals corresponding to respective piezoelectric elements PZ.

The piezoelectric element switch 44 includes 180 pieces of switch elements each of which corresponds to each of the piezoelectric elements PZ. To an input end of each of the switch elements, the driving waveform signal COM outputted from the controlling device 30 is inputted, while to an output end of each of the switch elements, a piezoelectric element PZ that corresponds to each of the switch elements is coupled. Each of the switch elements outputs the drive waveform signal COM to a corresponding piezoelectric element PZ in accordance with the switching signal corresponding to the piezoelectric element PZ. Accordingly, when a target point T1 is positioned at the discharge position P, the head driving circuit 40 outputs the drive waveform signal COM to a corresponding piezoelectric element PZ so as to discharge the droplet D to the target point T1, that is, the head driving circuit 40 allows the piezoelectric element PZ to execute the droplet discharge treatment corresponding to the dotted pattern data.

The first laser switch 45 includes 180 pieces of switch elements each of which corresponds to each of the first lasers LD1. To an input end of each of the switch elements, a power source Vcc outputted from the controlling device 30 is inputted, while to an output end of each of the switch elements, a first laser LD1 that corresponds to each of the switch elements is coupled. Each of the switching elements supplies a driving current to a corresponding first laser LD1 for a predetermined period of time in accordance with the parallel pattern data PI that relates with a corresponding nozzle N. Accordingly, when the droplet D is discharged to a target point T1, the head driving circuit 40 irradiates a first part corresponding to the target point T1 with the first laser light B1 for a predetermined period of time. That is, the head driving circuit 40 executes the drying treatment with the first laser light B1 based on the dotted pattern data. The predetermined period of time is set to be from a time at which the discharging operation of the droplet D starts to a time at which the droplet D exits the first part.

The second laser switch 46 includes 180×2 pieces of switch elements each of which corresponds to each of the second lasers LD2. To an input end of each of the switch elements, a power source Vcc outputted from the controlling device 30 is inputted, while, to an output end of each of the switch elements, a second laser LD2 that corresponds to each of the switch elements is coupled. Each of the switch elements supplies a driving current to a corresponding second laser LD2 for a predetermined period of time in accordance with the parallel pattern data PI that relates with a corresponding nozzle N.

Accordingly, when the droplet D is discharged to a target points T1, the head driving circuit 40 conducts an irradiation of the second laser light B1 with respect to a second part corresponding to the target point T1 for a predetermined period of time. That is, the head driving circuit 40 executes the drying treatment with the second laser light B2 based on the dotted pattern data. The predetermined period of time is set to be from time at which the discharging operation of the droplet D starts to time at which the droplet D exits the second part.

Here, advantageous effects of the first embodiment will be described.

(1) In the first embodiment, the droplet discharge head 20 is provided with the first lasers LD1 that correspond to respective discharge positions P in +Y direction of respective nozzles N, and is provided with the second lasers LD2 that correspond to the respective discharge positions P in +Y direction of the first lasers LD1. In a case where discharge paths R are defined as straight lines extending in +Y direction through discharge positions P, each of the first lasers LD irradiates a first part on a corresponding discharge path R with the first laser light B1, while each of the second lasers LD2 irradiates a second part on the corresponding discharge path R with the second laser light B2.

Therefore, when the droplet discharge head 20 executes the droplet discharging treatment, the droplet D that lands on the discharge position P sequentially passes the first part and the second part on a corresponding discharge path R. As a result, the droplet discharge device 20 can increase the irradiation time of the laser light B with respect to the droplet D in accordance with the number of the first laser LD1 and the second lasers LD2 independently from the moving velocity of the substrate S and the spot size of the laser light B. Therefore, the droplet discharge head 20 can irradiate the droplet D with the laser light B having low energy for a long period of time, being able to prevent bumping and a lack of drying of the droplet D. Accordingly, the droplet discharge head 20 can provide a stable drying state with respect to the droplet D under the drying condition corresponding to the composition and the size of the droplet D without degrading the performance in the droplet discharging treatment.

(2) In the first embodiment, the first laser LD1 and the second laser LD2 are vertical cavity surface emitting lasers mounted on a surface of the laser plate 22B opposed to the discharge surface SA. The emitting surface of the first laser LD1 and the second laser LD2 is nearly coplanar to the forming surface of the nozzles N. Therefore, the droplet discharge head 20 can mount the plurality of lasers LD on the head body 22 without expanding the platen gap. Accordingly, the droplet discharge head 20 can maintain the landing accuracy of the droplet D and can provide high positional-matching between the droplet D and an irradiation region of the laser light B.

(3) In the first embodiment, when the droplet discharge device 10 discharges the droplet D to a target point T1, the device 10 conducts an irradiation to a first part on a discharge path R corresponding to the target point T1 with the first laser light B1 from a first laser LD1 corresponding to the target point T1. Further, the droplet discharge device 10 conducts an irradiation to a second part corresponding to the target point T1 with the second laser light B2 from a second laser LD2 corresponding to the target point T1.

Therefore, when the droplet discharging treatment is executed, the droplet D landing on the target point T1 sequentially passes the first part and the second part that corresponds to the target point T1. As a result, the droplet discharge device 10 can increase the irradiation time of the laser light B with respect to the droplet D in accordance with the number of the first laser LD1 and the second lasers LD2 independently from the moving velocity of the substrate S and the spot size of the laser light B. Therefore, the droplet discharge device 10 can conduct an irradiation to the droplet D with the laser light B having low energy for a long period of time, being able to prevent bumping and a lack of drying of the droplet D. Accordingly, the droplet discharge device 10 can provide a stable drying state with respect to the droplet D under the drying condition corresponding to the composition and the size of the droplet D without degrading the performance in the droplet discharging treatment.

(4) In the first embodiment, the head driving circuit 40 generates the parallel pattern data PI for selecting a nozzle corresponding to a target point T1 among the plurality of nozzles N, and selectively drives each of the piezoelectric elements PZ based on the parallel pattern data PI. Further, the head driving circuit 40 selectively drives a first laser LD1 corresponding to the target point T1 among the plurality of first lasers LD1 based on the parallel pattern data PI. Furthermore, the head driving circuit 40 selectively drives a second laser LD2 corresponding to the target point T1 among the plurality of second lasers LD2 based on the parallel pattern data PI.

Therefore, each of the piezoelectric elements PZ, each of the first lasers LD1, and each of the second lasers LD2 are selectively driven based on a parallel pattern data PI which is common to them. As a result, the droplet discharge device 10 can more securely select the first laser LD1 and the second laser LD2 corresponding to a nozzle N that discharges the droplet D. Accordingly, the droplet discharge device 10 can more securely conduct an irradiation to the droplet D that is discharged with the first laser light B1 and the second laser light B2.

(5) In the first embodiment, the controlling device 30 generates a timing signal LAT when the grid point T0 is positioned on the discharge position P, and the head driving circuit 40 generates parallel pattern data PI in response to the timing signal LAT received from the controlling device 30.

Therefore, each of the piezoelectric elements PZ, each of the first lasers LD1, and each of the second lasers LD2 are driven based on a timing signal LAT which is common to them. Accordingly, the droplet discharge device 10 can conduct an irradiation to each droplet D that is discharged from each of the nozzles with the laser light B at more stable timing.

Second Embodiment

A second embodiment of the invention will be described below with reference to FIG. 6. In this second embodiment, the first lasers LD1 and the second lasers LD2 of the first embodiment are altered. Therefore, the alteration will be mainly described in detail. Elements that are common to the first embodiment are indicated by the same reference numerals.

Figure 6:
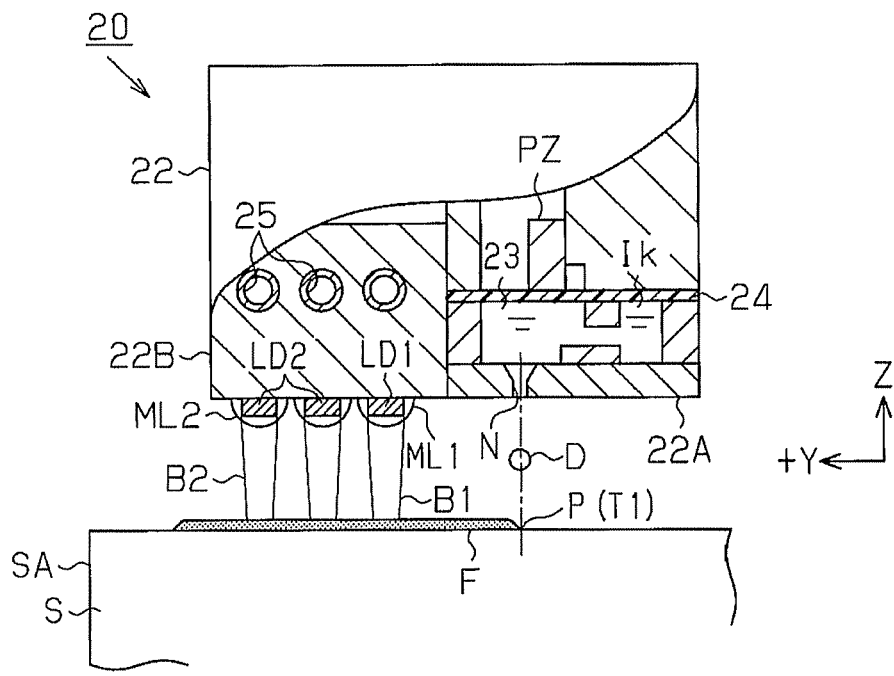
FIG. 6 is a sectional side view showing a droplet discharge head according to a second embodiment.

Referring to FIG. 6, the first laser LD1 has a first micro lens ML1 having a hemisphere face as a first optical system, and the second laser LD2 has a second micro lens ML2 also having a hemisphere face as a second optical system.

When the first laser LD1 emits the first laser light B1, the first micro lens ML1 narrows the emission angle of the first laser light B1 so as to focus the light on the first part. When the second laser LD2 emits the second laser light B2, the second micro lens ML1 narrows the emission angle of the second laser light B2 so as to focus the light on the second part. The energy density of the first laser light B1 that is focused is set to cause no bumping of the droplet D in the first part and to encourage the droplet D in the first part to be dried. The energy density of the second laser light B2 that is focused is set to cause no bumping of the droplet D in the second part and to encourage the droplet D in the second part to be dried.

The droplet D in the first part receives the first laser light B1 that is focused by the first micro lens ML1 under high irradiation accuracy so as to be dried without bumping. The droplet D in the second part receives the second laser light B2 that is focused by the second micro lens ML2 under high irradiation accuracy so as to be further dried.

As a method for manufacturing the first micro lens ML1 and the second micro lens ML2, a technique disclosed in the sixth example is used, for example. Namely, a droplet of a material of the lens is discharged on emitting surfaces of the first laser LD1 and the second laser LD2 by a droplet discharge head having nozzles formed at the same pitch as the forming pitch of the lasers LD. Then the droplet on each of the emitting surfaces is hardened, forming the first micro lens ML1 and the second micro lens ML2. Thus the first micro lens ML1 and the second micro lens ML2 are provided with high positional-matching with respect to each of the nozzles N.

(6) According to the second embodiment, each of the first micro lens ML1 and the second micro lens ML2 narrows the emission angle of the laser light, so that the droplet discharge device 10 can improve the irradiation accuracy of the laser light with respect to the first part and the second part.

(7) According to the second embodiment, each of the first micro lens ML1 and the second micro lens ML2 focuses the laser light, so that the droplet discharge device 10 can increase the energy density of the laser light. Therefore, the droplet discharge device 10 can expand the changing range of the irradiation amount under high irradiation accuracy. As a result, the drying state of the droplet can be further stabilized.

(8) According to the second embodiment, the first micro lens ML1 and the second micro lens ML2 respectively cover the first laser LD1 and the second laser LD2. Therefore, the droplet discharge device 10 can protect each of the lasers LD from the ink Ik, various solvents, and the like. Accordingly, the droplet discharge device 10 can stabilize the optical property of the laser light B.

Third Embodiment

A third embodiment of the invention will be described below with reference to FIG. 7. In the third embodiment, the second micro lens ML2 of the second embodiment is altered. Therefore, the alteration will be mainly described in detail. Elements that are common to the first embodiment are indicated by the same reference numerals.

Figure 7:
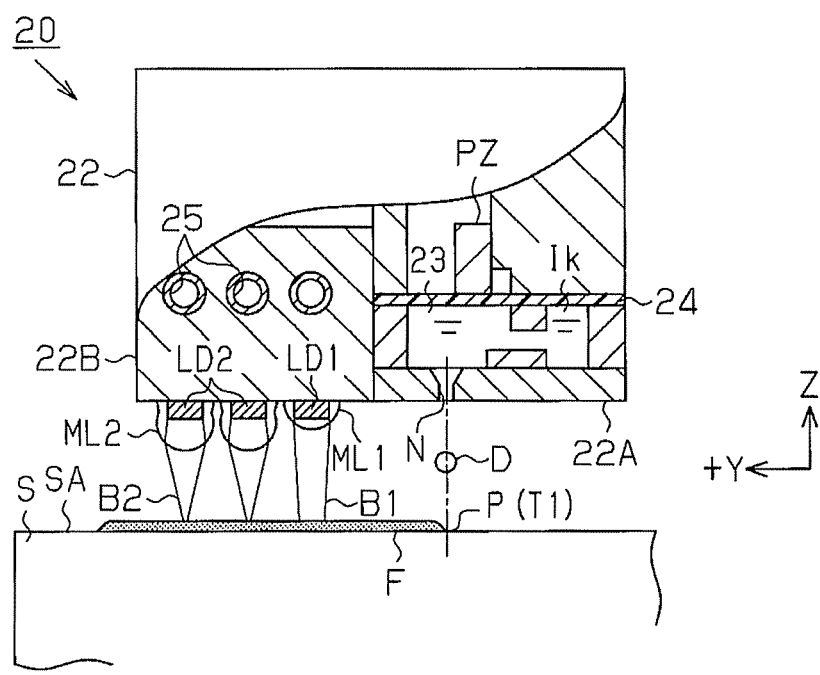
FIG. 7 is a sectional side view showing a droplet discharge head according to a third embodiment.

Referring to FIG. 7, the second micro lens ML2 has an optical face at a closer position to the discharge surface SA than the first micro lens ML1 and has higher light focusing rate than the first micro lens ML1.

When the second laser LD2 emits the second laser light B2, the second micro lens ML2 narrows the emission angle of the second laser light B2 so as to focus the light on the second part. The energy density of the second laser light B2 that is focused is higher than that of the first laser light B1 and is set to cause no bumping of the droplet D in the second part and to encourage the droplet D in the second part to be dried.

The droplet D in the first part receives the first laser light B1 that is focused by the first micro lens ML1 so as to be dried without bumping. The droplet D in the second part receives the second laser light B2 that is focused by the second micro lens ML2 so as to be further dried. At this time, since the energy density of the second laser light B2 is higher than that of the first laser light B1, the droplet discharge device 10 further encourages the droplet D in the second part to be dried.

As a method for manufacturing the second micro lens ML2, a technique disclosed in the sixth example is used, for example. Namely, a droplet of a material of the lens is discharged on an emitting surface of the second laser LD2 and the droplet on the emitting surface is hardened. Then the discharge of the droplet of the lens material and the hardening of the droplet are repeated several times, forming the second micro lens ML2.

(9) According to the third embodiment, the droplet D on the target point T1 first receives the first laser light B1 having a relatively lower energy density and then receives the second laser light B2 having a relatively higher energy density. Therefore, the droplet discharge device 10 can prevent bumping of the droplet D and more securely prevent the lack of drying of the droplet D.

Fourth Embodiment

A fourth embodiment of the invention will be described below with reference to FIGS. 8A and 8B. In the fourth embodiment, the first micro lens ML1 and the second micro lens ML2 of the second embodiment are altered. Therefore, the alteration will be mainly described in detail. Elements that are common to the first embodiment are indicated by the same reference numerals.

Figure 8A:
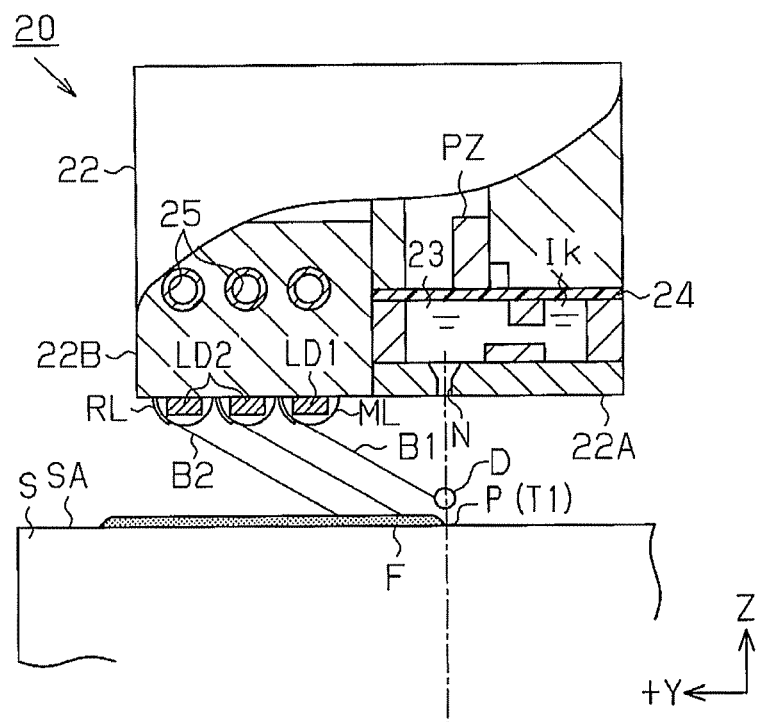
FIGS. 8A and 8B are respectively a sectional side view schematically showing a droplet discharge head and a plan view schematically showing a droplet discharging operation according to a fourth embodiment.
Figure 8B:
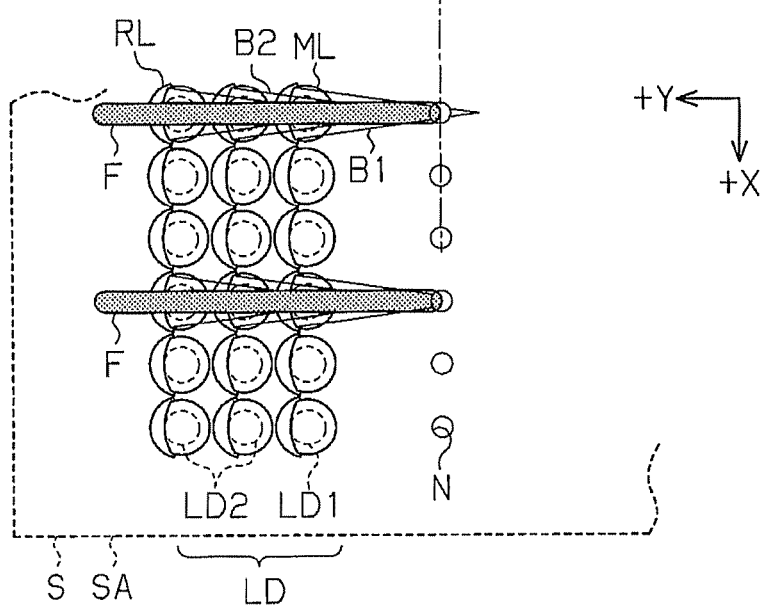

Referring to FIGS. 8A and 8B, each of the first micro lens ML1 and the second micro lens ML2 has a reflection film RL as a deflection member on an optical face in +Y direction. The reflection film RL is a thin film made of silver or aluminum, for example, and reflects the laser light B received from a corresponding laser LD.

The laser light B emitted from the first laser LD1 and the second laser LD2 travel in a radiate manner when viewed from Z direction. The reflection film RL receives a part of the laser light B emitted from a corresponding laser LD. The part of the laser light B travels in +Y direction when viewed from Z direction. The reflection film RL reflects the laser light B received from the corresponding laser LD to −Y direction when viewed from Z direction to focus it.

In other words, the reflection film RL receives the laser light B that travels in a direction away from a corresponding nozzle N (discharge position P) when viewed from Z direction. The reflection film RL reflects the laser light B received from the corresponding laser LD to a direction approaching the corresponding nozzle N (discharge position P) when viewed from Z direction. Then the laser light B reflected by the reflection film RL extends a corresponding first or second part in −Y direction.

When the first part or the second part is on the discharge position P, the droplet D discharged from the nozzle N receives the laser light B at the same time of its landing. When the first part or the second part is in −Y direction of the discharge position P, the droplet D receives the laser light B before its landing.

(9) According to the fourth embodiment, the first laser light B1 and the second laser light B2 are respectively reflected by the reflection film RL so as to travel in a direction approaching a corresponding discharge position P. As a result, the energy density of the laser light B increases in the vicinity of each discharge position P by an amount that the reflection film RL reflects the laser light B. Accordingly, the droplet discharge head 20 can change the energy density of the laser light B on the discharge path R. Therefore, the droplet discharge head 20 can expand the drying condition of the droplet D, being able to further stabilize the drying state of the droplet D.

(10) According to the fourth embodiment, since the laser light B reflected by the reflection film RL approaches the discharge position P, the droplet discharge head 20 can change the starting time of drying in the drying treatment of the droplet D. Thus the droplet discharge head 20 can expand the drying condition of the droplet D.

Fifth Embodiment

A fifth embodiment of the invention will be described below with reference to FIG. 9. In the fifth embodiment, the head driving circuit 40 of the first embodiment is altered. Therefore, the alteration will be mainly described in detail. Elements that are common to the first embodiment are indicated by the same reference numerals.

Figure 9:
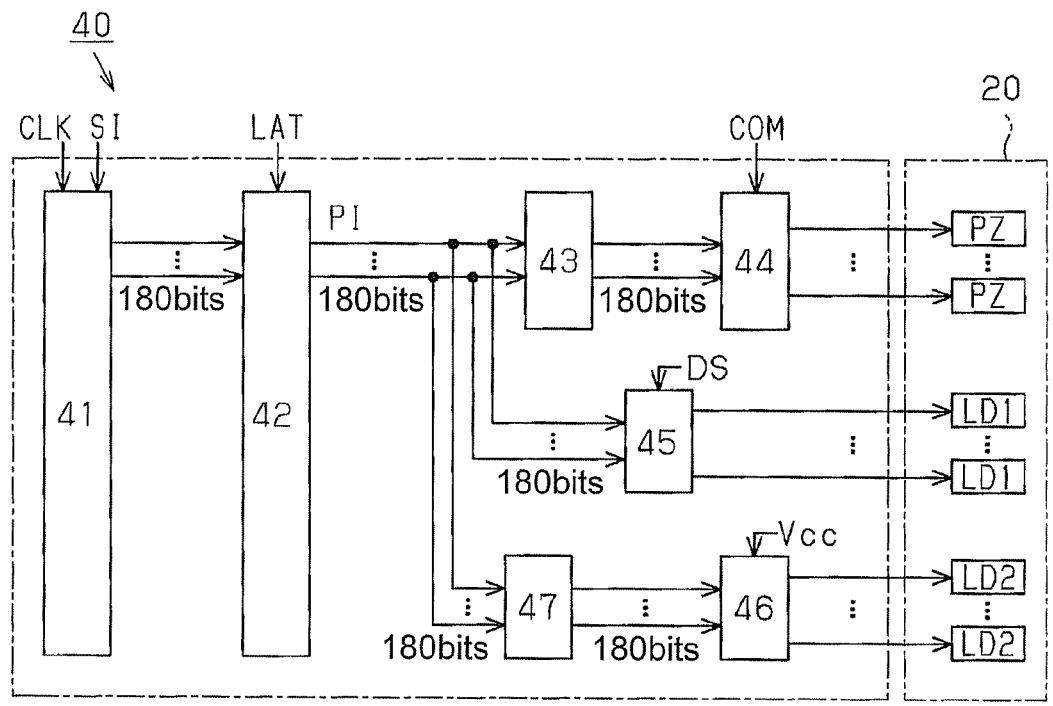
FIG. 9 is an electrical block diagram showing an electrical structure of a head driving circuit according to a fifth embodiment.

Referring to FIG. 9, a head driving circuit 40 includes a delay circuit 47. The control signal generating part 42 conducts serial/parallel conversion with respect to serial pattern data SI which is latched so as to generate parallel pattern data PI that corresponds to each of the nozzles N, outputting the parallel pattern data PI to the level shifter 43, the first laser switch 45, and the delay circuit 47.

The delay circuit 47 generates a signal obtained by delaying the parallel pattern data PI received from the control signal generating part 42 by a predetermined period of time as a switching signal and outputs the switching signal to the second laser switch 46. Specifically, the controlling device 30 as a delay signal generating part judges whether each of the grid points T0 enters the second part or not based on the moving direction and the moving amount of the stage 12, generates a delay signal DS when each of the grid points T0 enters the second part, and outputs the delay signal DS to the delay circuit 47. The delay circuit 47 receives the delay signal DS from the controlling device 30 to output the parallel pattern data PI that is stored therein to the second laser switch 46.

Each switching element of the second laser switch 46 supplies a driving current to corresponding second laser LD2 for a predetermined period of time in response to the switching signal outputted from the delay circuit 47. Here, the predetermined period of time is the time during which the droplet D on the target point T1 stays in the second part. Accordingly, the droplet discharge device 10 delays an irradiation of the second laser light B2 until the droplet on the target point T1 enters the second part. Then the droplet discharge device 10 continues the irradiation of the second laser light B2 until the droplet on the target point T1 exits the second part.

(11) According to the fifth embodiment, the head driving circuit 40 conducts an irradiation to the droplet D with the second laser light B2 for a period of time during which the droplet D on the target point T1 stays in the second part. Therefore, the droplet discharge device 10 can reduce the irradiation amount of the laser light B with respect to the substrate S, by an amount that the irradiation timing of the second laser LD 2 is delayed. As a result, the droplet discharge device 10 can reduce damage, which is caused by the laser light B, of the substrate S.

Sixth Embodiment

A sixth embodiment of the invention will be described below with reference to FIG. 10. In the sixth embodiment, the controlling device 30 and the head driving circuit 40 of the first embodiment are altered. Therefore, the alteration will be mainly described in detail. Elements that are common to the first embodiment are indicated by the same reference numerals.

Figure 10:
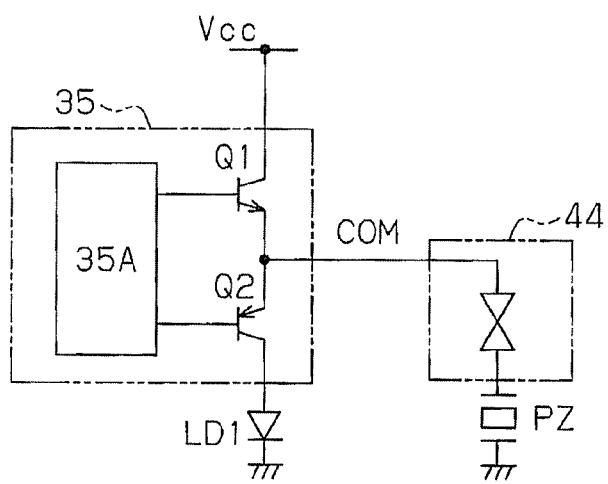
FIG. 10 is an electrical block diagram showing an electrical structure of the droplet discharge device according to a sixth embodiment.

Referring to FIG. 10, the driving waveform generating circuit 35 includes a conversion circuit 35A converting waveform data that is read out by the controller 31 into an analog signal. The driving waveform generating circuit 35 further includes an NPN transistor Q1 and a PNP transistor Q2 that are push-pull coupled to each of the piezoelectric elements PZ. A collector of each PNP transistor Q2 is grounded through a first laser LD1 corresponding to each of the piezoelectric elements PZ.

The driving waveform generating circuit 35 outputs a driving waveform signal COM to each of the piezoelectric elements PZ by a switching operation of the NPN transistor Q1 and the PNP transistor Q2. The piezoelectric element PZ is a capacitive load, so that when the piezoelectric element PZ receives the driving waveform signal COM, it repeats charging and discharging of electricity based on the driving waveform signal COM.

That is, the driving waveform generating circuit 35 turns the NPN transistor Q1 on and turns the PNP transistor Q2 off so as to charge the piezoelectric element PZ. Further, the driving waveform generating circuit 35 turns the NPN transistor Q1 off and turns the PNP transistor Q2 on so as to discharge the piezoelectric element PZ.

In this case, discharged current from the PNP transistor Q2 flows to the ground through the first laser LD1. Accordingly, when a piezoelectric element PZ executes the discharging operation of the droplet D, the droplet discharge device 10 drives a first laser LD1 corresponding to the piezoelectric element PZ by the discharged current.

(12) According to the sixth embodiment, each first laser LD is driven by discharged current from a corresponding pressure generating element, so that each droplet D that is discharged is more securely irradiated with corresponding first laser light B1. As a result, the droplet discharge device 10 can more securely stabilize the drying state of each droplet D.

The above-mentioned embodiments may be changed as the following.

In the first embodiment, the first lasers LD1 and the second lasers LD2 are aligned in +Y direction of their corresponding nozzles N. The invention is not limited to this, but both of the first lasers LD1 and the second lasers LD2 may be aligned in +Y direction and an opposite direction of +Y direction (−Y direction), so that each of the lasers LD aligned in +Y direction is driven when the substrate S is moved in +Y direction, and each of the lasers LD aligned in −Y direction is driven when the substrate S is moved in −Y direction. Accordingly, the discharging treatment of the droplet can be executed in both of the moving of the substrate S along +Y direction and the moving of the same along −Y direction, being able to enhance the performance in the discharging treatment.

In the first embodiment, the stage 12 is moved in +Y direction, so that the droplet discharge head 20 is relatively moved in −Y direction with respect to the substrate S. The invention is not limited to this, but the carriage 15 is structured to be able to move in −Y direction. The droplet discharge head 20 may be relatively moved in −Y direction with respect to the substrate S by the moving of the carriage 15 in −Y direction.

In the first embodiment, the nozzle plate 22A and the laser plate 22B are provided to the bottom part of the head body 22. The nozzles N are provided to the nozzle plate 22A and the lasers LD are provided to the laser plate 22B. The invention is not limited to this, but only the nozzle plate 22A may be provided to the bottom part of the head body 22, and both of the nozzles N and the lasers LD may be provided to the nozzle plate 22A in a sharing manner.

In the first embodiment, the droplet discharge head 20 employs a piezoelectric element driving system, but may employ a resistance heating system or a electrostatic driving system.

In the second embodiment, the first laser LD1 includes the first micro lens ML1 as the first optical system and the second laser LD2 includes the second micro lens ML2 as the second optical system. However, the invention is not limited to this. The first optical system and the second optical system may be shared, that is, the first laser LD1 and the second laser LD2 that are aligned in +Y direction may share one lenticular lens extending in +Y direction.

In the third embodiment, the second micro lens ML2 has higher light focusing rate than the first micro lens ML1. Therefore, the second laser light B2 provides higher energy to the droplet D than the first laser light B1. However, the invention is not limited to this. The head driving circuit 40 may make the driving current for the first laser LD1 lower than that for the second laser LD2, for example. Alternatively, the output of the first laser LD1 may be made lower than that of the second laser LD2. In this structure as well, the droplet D receives light having relatively low intensity when it is close to the nozzle N and receives light having relatively high intensity when it is apart from the nozzle N.

Accordingly, the droplet D that is discharged is slowly dried while preventing bumping when it is close to the nozzle N. Then the droplet D to be dried is pinned to the discharge surface SA at its periphery and after that, the droplet D is instantly dried when it is apart from the nozzle N.

In the above embodiments, the light is laser light emitted from the vertical cavity surface emitting laser. However, the invention is not limited to this. The light may be laser light from a semiconductor laser or light from an LED.

The entire disclosure of Japanese Patent Application No. 2007-185935, filed Jul. 17, 2007 is expressly incorporated by reference herein.

What is claimed is:

1. A droplet discharge device, comprising:
 a droplet discharge head discharging a droplet to an object; and
 a controlling unit drive-controlling the droplet discharge head by relatively moving the droplet discharge head and the object,
 wherein the droplet discharge head includes:
  a head body having a surface opposed to the object,
  a plurality of nozzles aligned on the surface and discharging the droplet to each of positions on the object opposed to the plurality of nozzles, and
  i×j pieces of irradiation parts arranged such that I (an integer number of 1 or more) pieces of irradiation parts are aligned along an alignment direction of the nozzles and j (an integer number of 2 or more) pieces of irradiation parts are disposed in a predetermined direction that is orthogonal to the alignment direction of the nozzles and aligned along the predetermined direction;
 wherein when the controlling unit allows the object to move relatively to the droplet discharge head in the predetermined direction so as to discharge the droplet to a selected position that is selected from the positions, the controlling unit allows the j pieces of irradiation parts disposed in the predetermined direction of a nozzle opposed to the selected position to irradiate the object with light;
 wherein the irradiation parts include first irradiation parts disposed in the predetermined direction of the nozzles and irradiating a first part of a line, the line passing through each of the positions opposed to the nozzles and extending along the predetermined direction, with the light, and second irradiation parts disposed in the predetermined direction of the first irradiation parts and irradiating a second part that is different from the first part on the line with the light, and
 wherein when the controlling unit relatively moves the droplet discharge head and the object so as to discharge the droplet on a selected position selected from the positions, the controlling unit allows one of the first irradiation parts disposed in the predetermined direction of a nozzle opposed to the selected position to irradiate the first part with light and allows the second irradiation parts disposed in the predetermined direction of the nozzle opposed to the selected position to irradiate the second part with light.

2. The droplet discharge device according to claim 1, wherein the light is laser light,
 wherein the first irradiation parts are mounted on the surface and include first vertical cavity surface emitting lasers emitting the laser light, and wherein the second irradiation parts are mounted on the surface and include second vertical cavity surface emitting lasers emitting the laser light.

3. The droplet discharge device according to claim 1, wherein the controlling unit allows light emitted form the first irradiation parts to have a smaller intensity than light emitted from the second irradiation parts.

4. The droplet discharge device according to claim 1,
wherein the controlling unit includes a selection signal generating part generating a selection signal for selecting a nozzle opposed to the selected position from the plurality of nozzles, and
wherein the controlling unit selectively drives the nozzle opposed to the selected position based on the selection signal, and selectively drives a first irradiation part disposed in the predetermined direction of the nozzle opposed to the selected part from the first irradiation parts and selectively drives a second irradiation part disposed in the predetermined direction of the nozzle opposed to the selected part from the second irradiation parts based on the selection signal.

5. The droplet discharge device according to claim 1,
wherein the controlling unit includes a timing signal generating part generating a timing signal expressing a discharge timing of the droplet, and
wherein the controlling unit drives the nozzles based on the timing signal, and drives each of the first irradiation parts and the second irradiation parts based on the timing signal.

6. The droplet discharge device according to claim 1,
wherein the first part is closer to each of the positions than the second part,
wherein the controlling unit includes a timing signal generating part generating a timing signal expressing a discharge timing of the droplet and a delay signal generating part generating a delay signal delaying for a predetermined period of time from the timing signal, and
wherein the controlling unit drives the nozzles based on the timing signal, drives the first irradiation parts based on the timing signal, and drives the second irradiation parts based on the delay signal.

7. The droplet discharge device according to claim 1,
wherein the nozzles include a pressure generating element that repeats charging and discharging of electricity so as to discharge the droplet, and
wherein the controlling unit includes a timing signal generating part generating a timing signal expressing a timing of charging and discharging of electricity of the pressure generating element; charges and discharges electricity of the pressure generating element of a predetermined nozzle; and supplies the first irradiation parts coupled to the pressure generating element with electricity discharged from the pressure generating element so as to drive the first irradiation parts.

* * * * *